United States Patent [19]

Maisch

[11] 4,284,051
[45] Aug. 18, 1981

[54] SWITCHING CONTROL APPARATUS FOR ELECTROMAGNETIC CONTROL UNITS

[75] Inventor: Wolfgang Maisch, Schwieberdingen, Fed. Rep. of Germany

[73] Assignee: Robert Bosch GmbH, Stuttgart, Fed. Rep. of Germany

[21] Appl. No.: 67,067

[22] Filed: Aug. 2, 1979

[30] Foreign Application Priority Data

Sep. 15, 1978 [DE] Fed. Rep. of Germany ....... 2840192
Feb. 22, 1979 [DE] Fed. Rep. of Germany ....... 2906835

[51] Int. Cl.$^3$ ............................................... F02B 3/00
[52] U.S. Cl. ..................................... 123/490; 123/499
[58] Field of Search ...... 123/32 EF, 119 EC, 32 EA, 123/32 EL; 361/154, 194; 251/129, 141

[56] References Cited

U.S. PATENT DOCUMENTS

| 2,084,426 | 6/1937 | Berry | 123/119 EC |
| 3,768,449 | 10/1973 | Lindberg | 123/32 EF |
| 3,786,344 | 1/1974 | Davis et al. | 123/32 EF |
| 3,809,028 | 5/1974 | Luchaco | 123/32 EL |
| 3,866,584 | 2/1975 | Bigalke et al. | 123/32 EL |
| 3,982,505 | 9/1976 | Rivere | 123/32 EF |
| 4,180,026 | 12/1979 | Schulzke et al. | 123/32 EF |

Primary Examiner—Charles J. Myhre
Assistant Examiner—R. A. Nelli
Attorney, Agent, or Firm—Edwin E. Greigg

[57] ABSTRACT

A method and apparatus for reliably switching electromagnetic control units, especially solenoid valves for blocking the idling fuel mixture in carburetor units of internal combustion engines during, for example, motor vehicle coasting. It is proposed to deenergize the solenoid valve at the beginning of the blocking operation for a time period ensuring a reliable valve release, initiating a current flow which preferably allows the solenoid valve to be at the brink of opening, and, at the desired instant of opening applying an overvoltage to the solenoid valve in a standby position, wherein the valve, though it has not as yet opened, requires merely a small additional pulse to open. The apparatus comprises an electrical switch connected in series with the solenoid valve which receives its control signal for deenergizing the solenoid from a timing element, the latter being responsive to engine operation parameters, such as air flow or pressure in the intake manifold, and a storage means for applying an additional or auxiliary pulse for opening the solenoid valve at a given instant and/or in response to operating parameters. Also disclosed is a protection arrangement for the circuitry of the apparatus in the event of a short circuit.

26 Claims, 3 Drawing Figures

SWITCHING CONTROL APPARATUS FOR ELECTROMAGNETIC CONTROL UNITS

BACKGROUND OF THE INVENTION

The present invention relates to a method and apparatus for controlling the operation of electromagnetic control units, especially solenoid valves, used in internal combustion engines.

Conventionally, a high current is passed through the solenoid valve for rapid response for a rapid opening of the valve, and, after the valve opens, this current is then reduced to the so-called holding current. Thus, to open a solenoid valve rapidly, a higher current and thus a large energy storage means is required to make the rapid response energy available. This, in turn, entails a relatively high cost.

This invention is especially useful for opening and closing solenoid valves of carburetor units of internal combustion engines for blocking the carburetor units from idling fuel during a motor vehicle coasting operation.

Idling shutoff valves in carburetor units and the control of these valves are known. In such units, fuel feed via the idling nozzle of the carburetor is cut off when the ignition is turned off to prevent the internal combustion engine from continuing its running; a condition known as "dieseling".

On the other hand, certain known types of carburetors instead of cutting off the idling fuel feed, block the idling mixture by a blocking valve when the ignition is turned off. Such a mixture blocking valve has a relatively large mass so that increased current is required to open the valve in a vehicle coasting operation against the vacuum suction force, which force is high during this stage. This means that a correspondingly large armature and winding for the electromagnetic part of the valve is required.

OBJECTS, SUMMARY AND ADVANTAGES OF THE INVENTION

It is an object of the invention to provide a method and apparatus for the rapid switching of solenoid valves.

It is another object of the invention to provide a method and apparatus for cutting off idling mixture during the coasting operation of a motor vehicle and to do so by utilizing a relatively small electromagnetic part of the solenoid valve.

The method of this invention which accomplishes the foregoing objects is advantageous in that the energy required for operating an electromagnetic control unit, especially a solenoid valve, can be kept at a very low level, yet a reliable and exactly timed switching of the control unit is made possible. This is accomplished by deenergizing the control unit at the commencement of the coasting operation for insuring a reliable closing of the valve of the control unit and thereafter initiating a current flow at a level which allows the control unit to be at the brink of responding. Then, when an instantaneous response is required, such as at the end of the coasting operation, an auxiliary signal is applied to the excitation winding of the control unit.

The apparatus which accomplishes the method, and which has application wherever an electromagnetic valve is employed in a system having operating parameters associated therewith which can be correlated to the operation of the valve, comprises, in combination with the electromagnetic control unit, a switch which receives its actuating signal from a timing element which, in turn, is responsive to certain engine operating parameters, together with a storage means, such as a capacitor, for providing an auxiliary signal to be fed to the excitation winding at predetermined instances and/or at certain operating parameters of the system.

In the application of this invention to the coasting operation of a motor vehicle, the operating parameters can be speed, or air pressure in the intake manifold of the internal combustion engine.

Another advantage of the apparatus of this invention is that means are also provided for protecting the current switching elements for the excitation winding against the occurrence of a possible short circuit in the solenoid valves so that there is no unduly high current flowing through the switching elements.

BRIEF DESCRIPTION OF THE DRAWINGS

One embodiment of the invention with a solenoid valve is illustrated in the drawings and will be explained in greater detail in the following description. In the drawings.

DESCRIPTION OF THE PREFERRED EMBODIMENT

Figure 1A:
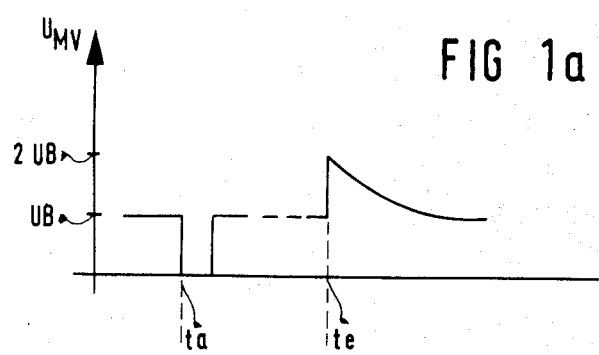
FIGS. 1a and 1b show a pulse diagram of a solenoid valve voltage as well as the current flowing through the excitation winding.
Figure 1B:
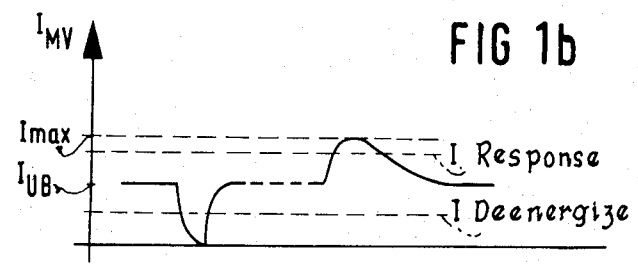

FIG. 1 shows the pulse characteristic of the signal across and through the excitation winding of the solenoid valve for full shutoff in carburetor units of internal combustion engines during coasting. In this context, FIG. 1a shows the voltage applied to the excitation winding and FIG. 1b shows the current flowing through this excitation winding. It can be seen from FIG. 1a that there is a voltage drop at the beginning of a coasting operation (ta) and a voltage rise a short time thereafter. At the end of the coasting operation (te), the voltage across the solenoid valve is greatly increased to attain a reliable response and thus a secure switching operation. This increase is effective only for a brief period of time as a function of the discharge of a storage means; the voltage then drops again to the normal operating voltage UB.

Correspondingly, FIG. 1b shows the current flow through the excitation winding of the solenoid valve. The curve corresponds essentially to the configuration of the diagram of FIG. 1a, but the flanks are rounded out due to the physical relationship between current and voltage in an inductance. FIG. 1b clarifies the period of time required for shutting off the voltage following the beginning of the coasting operation, so that the solenoid valve can be reliably deenergized. Thereafter, the current flow through the excitation winding must be lowered to such a degree that the solenoid valve closes. This closing is ensured if the time period of voltage cutoff is selected to be of such a length that the excitation current drops to zero, even in conjunction with a freewheeling circuit.

The magnitude of current $I_{UB}$ corresponds to the holding current for the solenoid valve. This holding current, however, is insufficient for opening the solenoid valve during coasting operation, since an increased supply of energy is needed for this purpose. An opening current, therefore, must be additionally supplied to the holding current, which occurs during the period of application of the increased voltage, where the valve current rises to $I_{max}$. This is indicated by two horizontally dashed lines for the response current and the deenergizing current (I RESPONSE and I DEENERGIZE). Thus, FIG. 1b actually shows the hysteresis characteristic in the switching behavior of the solenoid valve.

Figure 2:
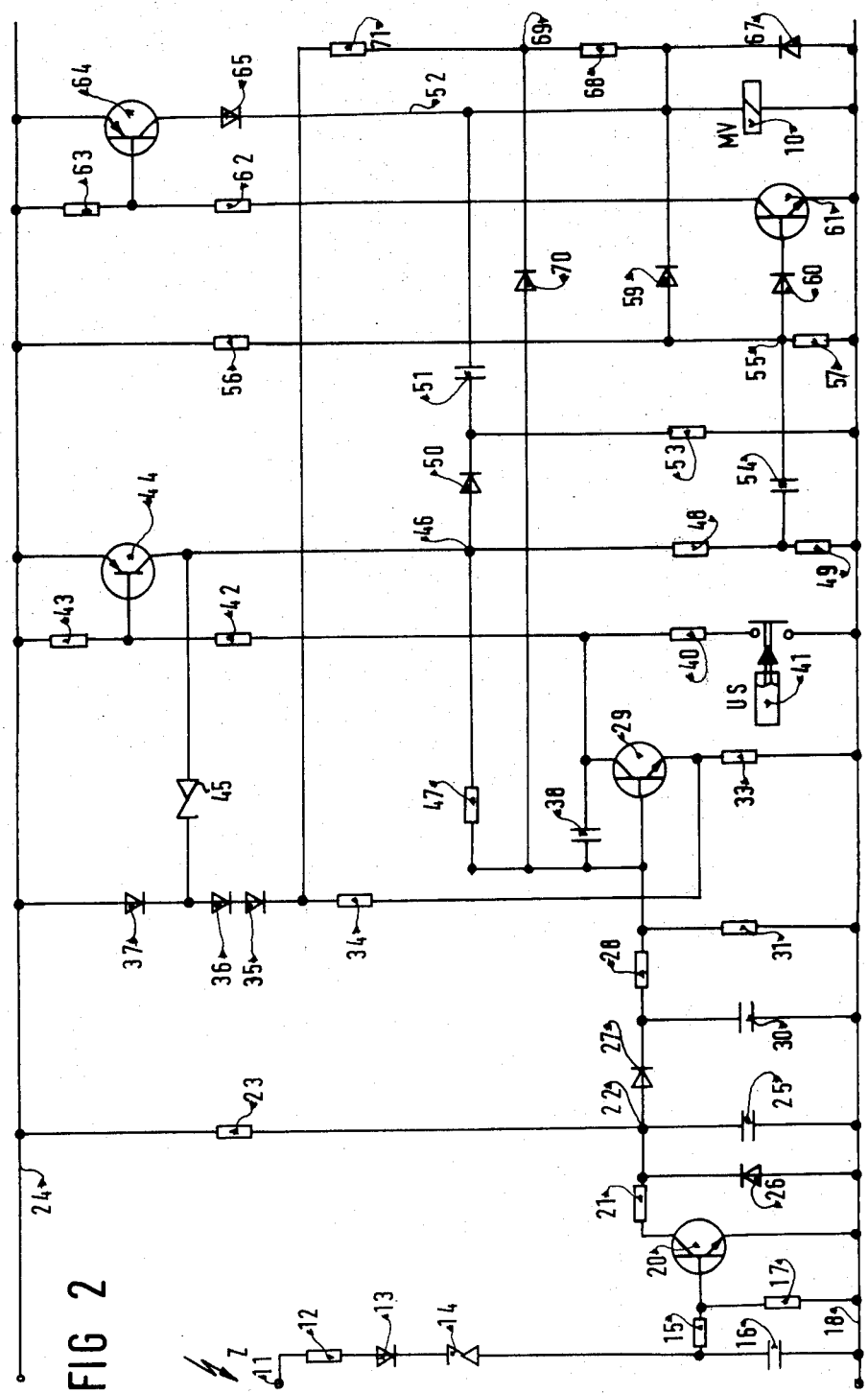
FIG. 2 shows practical circuitry for reliably switching solenoid valves.

A circuit arrangement for accomplishing the curves indicated in FIG. 1a and 1b is shown in FIG. 2. Numeral 10 denotes the electrical system of a solenoid valve, in front of which is connected a signal control unit whose operation is dependent upon the occurrence of, for example, the coasting operation of the internal combustion engine.

The following describes the circuit arrangement of the invention in detail:

A speed signal derived, for example, from the ignition and proportional to its frequency is applied to an input terminal 11. Connected after this input are a resistor 12, a diode 13, as well as a Zener diode 14. A resistor 15 follows, which is coupled, on the input side, via a capacitor 16 and, on the output side, via a resistor 17, to a ground line 18. The junction point of the two resistors 15 and 17 is connected to the base of a transistor 20. The emitter of transistor 20 is connected directly to ground, while the collector of this transistor is connected via a resistor 21 to a junction point 22. This junction point 22 is connected via a resistor 23 to a positive line 24. Furthermore, a parallel circuit of capacitor 25 and diode 26 is connected to ground, and finally there follows a series connection of a diode 27 and a resistor 28 to the base of a transistor 29. On the input side, the resistor 28 is connected, via a capacitor 30, and, on the output side, via a resistor 31, to the ground line 18.

The transistor 29 is connected to ground, on the emitter side, via a resistor 33 and is further connected to the positive line 24 via a series circuit of resistor 34 and three diodes 35–37. A capacitor 38 is connected in parallel to the collector-base path of this transistor 29. The collector of transistor 29 can be connected to ground via a resistor 40 and a switch 41; the latter being operable by the vacuum in the air intake manifold. Moreover, this collector is connected to the positive line 24 by way of a series circuit of two resistors 42 and 43. A transistor 44 is connected at its base to the junction point of the two resistors 42 and 43. On the emitter side, this transistor is connected to the positive line 24, whereas the collector is coupled, on the one hand, via a Zener diode 45, to the junction point of the two diodes 36 and 37 and further to a junction point 46. This junction point 46 is connected, via a resistor 47, to the base of transistor 29, and further, via a series circuit of two resistors 48 and 49 to ground, and via a diode 50 and a capacitor 51, to a line 52 leading to the solenoid valve 10. The junction point of diode 50 and capacitor 51 is further connected to ground via a resistor 53. Besides, a capacitor 54 is connected from the junction point of the two resistors 48 and 49 to a junction point 55 which latter, in turn, represents a voltage divider point of two resistors 56 and 57 between the positive line 24 and the ground line 18, and from which a diode 59 is connected to the junction line 52 and a diode 60 is connected to the base of a transistor 61, the emitter of which is connected to ground. On the collector side, the transistor 61 is connected by way of a series circuit of two resistors 62 and 63 to the positive line 24. The junction point of the two resistors 62 and 63 is coupled to the base of a switching transistor 64. The emitter of transistor 64 is directly connected to the positive line 24, whereas its collector is connected via a diode 65 to the connecting line 52. A freewheel diode 67 is inserted in parallel to the solenoid valve 10. Furthermore, a resistor 68 is connected from the connecting line 52 to a junction point 69, which latter is connected, on the one hand, via a diode 70 to the base of transistor 29 and via a resistor 71 to the junction point of diode 35 and resistor 34.

The mode of operation of the circuit arrangement shown in FIG. 2 is as follows:

The solenoid valve 10 is assumed to be open, since its excitation winding has current flowing therethrough. This presupposes transistor 64 as well as transistor 61 are conductive. Correspondingly, the relationship between the two resistors 56 and 57 must be selected so that the transistor 61 is kept continuously conductive. At the beginning of the coasting operation, the transistor 61, and also the transistor 64 are blocked, and a voltage drop rendered at the junction point 46. This, in turn, entails an interruption of the current flow in transistor 44, which is accomplished by opening switch 41. The speed of the engine is assumed to be so high during this procedure that the transistor 29 is nonconductive. Accordingly, at the beginning of the coasting operation, i.e. when the throttle valve returns to the idling position, an interruption of the current flow through the solenoid valve 10 is ensured.

The input circuit with the two transistors 20 and 29, as well as the various RC members, serve to render the above-described process dependent on the speed. The speed-dependent input signal at the input 11 makes the transistor 20 conductive in response to the frequency of the ignition pulses. Since the collector-emitter path of the transistor 20 is connected in parallel with the storage capacitor 25, which latter is continuously charged via resistor 23, there is only an intermittent charging current flow to the capacitor 30 via diode 27. The voltage applied to capacitor 30 only occurs below a specific engine speed where the transistor 29 becomes conductive. Correspondingly, the transistor 29 becomes nonconductive only at higher engine speeds. For this reason, the opening and closing of switch 41 is of significance only if the internal combustion engine runs at higher speeds when the transistor 29 is blocked.

At the beginning of the coasting operation, the switch 41 has been opened, the transistor 44 has been made nonconductive, and transistors 61 and 64 likewise has been blocked via capacitor 54. After the discharge time of the capacitor 54 has elapsed, the base potential of the transistor 61 again assumes such a high value that this transistor becomes conductive. This also holds true for transistor 64 and, as a result, the solenoid valve 10 is again connected to the operating voltage. This voltage, now is insufficient, however, for opening the solenoid valve; rather, the latter is kept in a kind of "standby position" until either the so-called resumptive speed value is exceeded in the downward direction or, the throttle valve opens up.

During this standby position for the solenoid valve 10, the capacitor 51 is charged approximately to the operating voltage.

If the operator of the motor vehicle causes the throttle valve to open, then the switch 41 closes and renders, in turn, the transistor 44 conductive. The voltage surge at the junction point 46 is transmitted via the diode 50 to the capacitor 51, which latter transmits this surge, in turn, to the connecting line 52. Consequently, a short-term overvoltage occurs across the solenoid valve 10 which corresponds to the illustration in FIG. 1a, and thus there is a current increase in the excitation winding of the solenoid valve.

The same effect, as obtained in closing the switch 41 during the opening of the throttle valve, is also attained when the speed drops to below the so-called resumptive speed, at which the transistor 29 is operated to become conductive.

The time period of overvoltage is dependent on the time characteristic of the circuit containing the capacitor 51, since, following an overvoltage, there takes place compensating processes for the capacitor charge. The voltage across the solenoid valve 10 present during the rest condition corresponds essentially to the battery voltage, and this potential is sufficient to keep the once-opened solenoid valve in the opened position. A change in the condition of the solenoid valve 10 occurs only once the switch 41 is opened again and thus the transistors 61 and 64 are rendered nonconductive, if even for an only short period of time, via capacitor 54.

In case of an inadvertent short-circuiting of the solenoid valve terminal to ground, for example when working on the unit without turning off the ignition, the final-stage transistor 64 is saved from destruction by making diodes 59 and 70 conductive, resulting in blocking of the transistor 29 and thus also transistors 44 and 61, and therewith also 64.

In summation, the aforedescribed circuit arrangement ensures a reliable switching of a solenoid valve for coasting cutoff in carburetor units at the beginning and at the end of the coasting operation, and protection is ensured for the final-stage transistor in case of short-circuiting of the solenoid valve.

Finally, it should be pointed out that the present invention can be utilized in a very general way, i.e. wherever electromagnetic control units are to be controlled rapidly, simply, and with a minimum of power. One example for the various other possible uses worth mentioning is the control of electromagnetic injection valves.

What is claimed and desired to be secured by Letters Patent of the United States is:

1. In a system employing an electromagnetic control unit, the control unit having an excitation winding, an apparatus for reliably switching the control unit between an open and closed condition, the improvement in the apparatus comprising:
   (a) an electrical switch connected in series with the excitation winding, said electrical switch having an actuating signal applied thereto;
   (b) timing means connected to the electrical switch and responsive to operating parameters of the system for controlling the actuating signal applied to the electrical switch; and
   (c) energy storing means for supplying, at a predetermined instant, an auxiliary signal directly to the excitation winding for switching the control unit to its open condition,
   said energy storing means comprising a series circuit connected in parallel with the excitation winding, said series circuit including a capacitor and a resistor connected in series with the capacitor, and wherein a positive voltage is maintained at the junction between the capacitor and the resistor of the series circuit when the auxiliary signal is applied to the excitation winding.

2. In the system of the improved apparatus as defined in claim 1, wherein the system comprises an internal combustion engine, and wherein the timing means is responsive to engine speed.

3. In the system of the improved apparatus as defined in claim 1, wherein the system comprises an internal combustion engine, and wherein the timing means is responsive to the air flow rate into the engine.

4. In the system of the improved apparatus as defined in claim 1, wherein the system comprises an internal combustion engine, and wherein the timing means is responsive to engine manifold pressure.

5. In the apparatus as defined in claim 1, wherein the improvement further comprises:
   (d) a parallel circuit connected to the timing means, wherein one leg of the parallel circuit includes a manifold pressure dependent switch and the other leg of the parallel circuit includes an engine speed dependent switch, and wherein the parallel circuit controls the operation of the timing means.

6. In the apparatus as defined in claim 5, wherein the improvement further comprises:
   (e) a transistor, two diodes and a diode-resistor combination, wherein the engine speed dependent switch comprises a transistor, and wherein the positive terminal of the excitation winding is coupled via the two diodes to the base of said transistor, and via the diode-resistor combination to the base of said speed dependent transistor.

7. In the apparatus as defined in claim 1, wherein the improvement further comprises:
   (d) a parallel circuit connected to the timing means, wherein one leg of the parallel circuit includes an airflow rate dependent switch and the other leg of the parallel circuit includes an engine speed dependent switch, and wherein the parallel circuit controls the operation of the timing means.

8. In the apparatus as defined in claim 7, wherein the improvement further comprises:
   (e) a transistor, two diodes and a diode-resistor combination, wherein the engine speed dependent switch comprises a transistor, and wherein the positive terminal of the excitation winding is coupled via the two diodes to the base of said transistor, and via the diode-resistor combination to the base of said speed dependent transistor.

9. In a system employing an electromagnetic control unit, the control unit having an excitation winding, an apparatus for reliably switching the control unit between an open and closed condition, the improvement in the apparatus comprising:
   (a) an electrical switch connected in series with the excitation winding, said electrical switch having an actuating signal applied thereto;
   (b) timing means connected to the electrical switch and responsive to operating parameters of the system for controlling the actuating signal applied to the electrical switch; and
   (c) energy storing means for supplying, in dependence on said operating parameters, an auxiliary signal directly to the excitation winding for switching the control unit to its open condition,
   said energy storing means comprising a series circuit connected in parallel with the excitation winding, said series circuit including a capacitor and a resistor connected in series with the capacitor, and wherein a positive voltage is maintained at the junction between the capacitor and the resistor of the series circuit when the auxiliary signal is supplied to the excitation winding.

10. In the system of the improved apparatus as defined in claim 9, wherein the system comprises an internal combustion engine, and wherein the timing means is responsive to engine speed.

11. In the system of the improved apparatus as defined in claim 9, wherein the system comprises an internal combustion engine, and wherein the timing means is responsive to the air flow rate into the engine.

12. In the system of the improved apparatus as defined in claim 9, wherein the system comprises an internal combustion engine, and wherein the timing means is responsive to engine manifold pressure.

13. In the apparatus as defined in claim 9, wherein the improvement further comprises:
  (d) a parallel circuit connected to the timing means, wherein one leg of the parallel circuit includes a manifold pressure dependent switch and the other leg of the parallel circuit includes an engine speed dependent switch, and wherein the parallel circuit controls the operation of the timing means.

14. In the apparatus as defined in claim 13, wherein the improvement further comprises:
  (e) a transistor, two diodes and a diode-resistor combination, wherein the engine speed dependent switch comprises a transistor, and wherein the positive terminal of the excitation winding is coupled via the two diodes to the base of said transistor, and via the diode-resistor combination to the base of said speed dependent transistor.

15. In the apparatus as defined in claim 9, wherein the improvement further comprises:
  (d) a parallel circuit connected to the timing means, wherein one leg of the parallel circuit includes an airflow rate dependent switch and the other leg of the parallel circuit includes an engine speed dependent switch, and wherein the parallel circuit controls the operation of the timing means.

16. In the apparatus as defined in claim 15, wherein the improvement further comprises:
  (e) a transistor, two diodes and a diode-resistor combination, wherein the engine speed dependent switch comprises a transistor, and wherein the positive terminal of the excitation winding is coupled via the two diodes to the base of said transistor, and via the diode-resistor combination to the base of said speed dependent transistor.

17. In a system employing an electromagnetic control unit, the control unit having an excitation winding, an apparatus for reliably switching the control unit between an open and closed condition, the improvement in the apparatus comprising:
  (a) an electrical switch connected in series with the excitation winding, said electrical switch having an actuating signal applied thereto;
  (b) timing means connected to the electrical switch and responsive to operating parameters of the system for controlling the actuating signal applied to the electrical switch; and
  (c) energy storing means for supplying, at a predetermined instant and in dependence on said operating parameters, an auxiliary signal directly to the excitation winding for switching the control unit to its open condition,
  said energy storing means comprising a series circuit connected in parallel with the excitation including a capacitor and a resistor connected in series with the capacitor, and wherein a positive voltage is maintained at the junction between the capacitor and the resistor of the series circuit when the auxiliary signal is supplied to the excitation winding.

18. In the system of the improved apparatus as defined in claim 17, wherein the system comprises an internal combustion engine, and wherein the timing means is responsive to engine speed.

19. In the system of the improved apparatus as defined in claim 17, wherein the system comprises an internal combustion engine, and wherein the timing means is responsive to the air flow rate into the engine.

20. In the system of the improved apparatus as defined in claim 17, wherein the system comprises an internal combustion engine, and wherein the timing means is responsive to engine manifold pressure.

21. In the apparatus as defined in claim 17, wherein the improvement further comprises:
  (d) a parallel circuit connected to the timing means, wherein one leg of the parallel circuit includes a manifold pressure dependent switch and the other leg of the parallel circuit includes an engine speed dependent switch, and wherein the parallel circuit controls the operation of the timing means.

22. In the apparatus as defined in claim 21, wherein the improvement further comprises:
  (e) a transistor, two diodes and a diode-resistor combination, wherein the engine speed dependent switch comprises a transistor, and wherein the positive terminal of the excitation winding is coupled via the two diodes to the base of said transistor, and via the diode-resistor combination to the base of said speed dependent transistor.

23. In the apparatus as defined in claim 17, wherein the improvement further comprises:
  (d) a parallel circuit connected to the timing means, wherein one leg of the parallel circuit includes an airflow rate dependent switch and the other leg of the parallel circuit includes an engine speed dependent switch, and wherein the parallel circuit controls the operation of the timing means.

24. In the apparatus as defined in claim 23, wherein the improvement further comprises:
  (e) a transistor, two diodes and a diode-resistor combination, wherein the engine speed dependent switch comprises a transistor, and wherein the positive terminal of the excitation winding is coupled via the two diodes to the base of said transistor, and via the diode-resistor combination to the base of said speed dependent transistor.

25. In an apparatus for switching an electromagnetic valve employed with an internal combustion engine, between an open and closed condition, the improvement comprising:
  (a) an electrical switch connected in series with the excitation winding, said electrical switch having an actuating signal applied thereto;
  (b) timing means connected to the electrical switch and responsive to engine speed and engine manifold pressure for controlling the actuating signal applied to the electrical switch for opening and closing said switch, such that the electrical switch is closed when a predetermined engine speed and manifold pressure exist and subsequently opened at a predetermined time thereafter; and
  (c) energy storing means connected to the excitation winding and the timing means for supplying, when the electrical switch has been subsequently opened, an auxiliary signal directly to the excitation winding for switching the electromagnetic valve to its open condition, said energy storing means comprising a series circuit connected in parallel with the excitation winding, said series circuit including a capacitor and a resistor in series with the capacitor, and wherein a positive voltage is maintained at the junction between the capacitor and the resistor of the series circuit when the auxiliary signal is supplied to the excitation winding.

26. In the apparatus as defined in claim 25, wherein the timing means includes a capacitor which controls the predetermined time after which the electrical switch is subsequently opened.

* * * * *